US005703544A

United States Patent [19]

Hays III

[11] Patent Number: 5,703,544

[45] Date of Patent: Dec. 30, 1997

[54] RF PRINTED CIRCUIT MODULE AND METHOD OF MAKING SAME

[75] Inventor: William Witherspoon Hays III, Lynchburg, Va.

[73] Assignee: Ericsson Inc., Research Triangle Park, N.C.

[21] Appl. No.: 615,653

[22] Filed: Mar. 13, 1996

[51] Int. Cl.$^6$ .............................. H03H 7/01; G01R 27/04

[52] U.S. Cl. ............................ 333/185; 29/593; 333/204

[58] Field of Search .................................... 333/202, 204, 333/219, 219.1, 246, 185; 361/777, 813; 29/593, 829, 830, 846, 852; 174/250, 251, 256, 258

[56] References Cited

U.S. PATENT DOCUMENTS

| | | | |
|---|---|---|---|
| 3,701,958 | 10/1972 | Jaag | 333/185 |
| 4,063,201 | 12/1977 | Komatsubara et al. | 333/168 |
| 4,758,922 | 7/1988 | Ishigaki et al. | 361/330 |
| 4,916,417 | 4/1990 | Ishikawa et al. | 333/204 |
| 5,032,803 | 7/1991 | Koch | 29/830 X |
| 5,237,296 | 8/1993 | Mandai et al. | 333/161 |
| 5,300,903 | 4/1994 | Okamura et al. | 333/204 |
| 5,448,209 | 9/1995 | Hirai et al. | 333/204 |
| 5,493,769 | 2/1996 | Sakai et al. | 29/593 |

FOREIGN PATENT DOCUMENTS

| | | | |
|---|---|---|---|
| 5063403 | 3/1993 | Japan | 333/204 |
| 5-235619 | 9/1993 | Japan | 333/204 |

*Primary Examiner*—Robert Pascal
*Assistant Examiner*—Barbara Summons

[57] ABSTRACT

The present invention discloses an RF printed circuit module and the method of making it. The RF printed circuit module includes a first single-clad sheet having a dielectric layer and a metal layer attached to a top surface thereof, a second single-clad sheet having a dielectric layer and a metal layer attached to a bottom surface thereof, and a double-clad sheet having a dielectric layer with a first metal layer attached to a top surface and a second metal layer attached to a bottom surface, wherein the double-clad sheet is positioned between and attached to the first and second single-clad sheets. The first and second metal layers of the double-clad sheet are etched to form desired lumped and distributed circuit elements thereon. The metal layers of the first and second single-clad sheets are etched to provide ground planes and portions of external terminals for the RF printed circuit module. The RF printed circuit module is edge-plated along the perimeter thereof to connect the metal layers of the first and second single-clad sheets, with a portion of such edge-plating being removed on one side of the RF printed circuit module to form a pair of external terminals to permit electrical connection thereto by a surface mounting arrangement.

36 Claims, 5 Drawing Sheets

RF PRINTED CIRCUIT MODULE AND METHOD OF MAKING SAME

BACKGROUND OF THE INVENTION

1. Field of the Invention

The present invention relates to electronic modules utilized with RF devices and, more particularly, to an RF printed circuit module and a method of making such RF electronic modules using printed circuit fabrication techniques.

2. Description of Related Art

Printed circuit fabrication techniques are well known and have been utilized in the construction of electronic components for several years. The advantages of such techniques include the ability to reduce the size of electronic components, as well as reduce the relative expense of producing them. Nevertheless, process variations have prevented the use of printed circuit fabrication techniques in the construction of electronic modules for the RF communication environment, such as for RF bandpass filters and RF couplers.

More specifically, it has been found that production of such RF electronic modules typically requires certain post-production processes which either tune the electronic module or involve certain measurement and selection operations. These post-production processes not only require additional time and cost, but may also involve a substantial loss relating to defective components. Another process variation related to the use of printed circuit fabrication techniques for the construction of. RF electronic modules is performance degradation of the module stemming from interlayer registration errors. This can occur quite frequently with regard to the capacitance values of capacitive plates which may be etched on adjacent metal layers of the module.

Further, since electronic modules are produced in mass quantities in various layouts on panels or frames, they generally have required some type of mechanical or electrical part to be added thereto for electrical connection or mounting (such as to a host printed circuit board). Such mechanical or electrical parts would include, for example, pins, pin arrays, clips, connectors, or the like. This is disadvantageous from a standpoint of adding an additional step to the manufacturing process, as well as limiting the potential mounting options of the module.

Finally, the module itself generally requires some type of housing in order to provide necessary shielding from electromagnetic and other types of interference. Such a housing not only serves to enlarge the overall size of the electronic module, but must also be specially configured for the addition of the electrical or mechanical parts added for the electrical connection or mounting of the electronic module.

In light of the foregoing concerns, it is a primary object of the present invention to provide an RF printed circuit module and a process for making electronic modules to be utilized in the RF communications environment using only printed circuit board processing techniques to construct the complete circuitry, shielding, and mounting accommodations of such modules.

It is another object of the present invention to provide an RF printed circuit module and a process for making such RF printed circuit modules which eliminates the traditional post-production processes for tuning such modules.

It is still another object of the present invention to provide an RF printed circuit module and a process for making such RF printed circuit modules which minimizes the effect of interlayer registration errors within the module.

Yet another object of the present invention is to provide an RF printed circuit module and a process for making such RF printed circuit modules which eliminates the need for any additional connecting hardware for the module.

Still another object of the present invention is to provide an RF printed circuit module and a process for making such RF printed circuit modules which enables it to have multiple mounting configurations.

Another object of the present invention is to provide an RF printed circuit module and a process for making such RF printed circuit modules which connects the individual modular layers and also provides a complete enclosure for shielding and grounding purposes.

A further object of the present invention is to provide an RF printed circuit module and a process for making such RF printed circuit modules which enables a high repeatability of production within desired quality control parameters.

These objects and other features of the present invention will become more readily apparent upon reference to the following description when taken in conjunction with the following drawings.

SUMMARY OF THE INVENTION

In accordance with one aspect of the present invention, an electronic module for an RF device is disclosed as including a first single-clad sheet, a second single-clad sheet, and at least one double-clad sheet positioned between the first and second single-clad sheets. The first single-clad sheet includes a dielectric layer having a metal layer attached to a top surface thereof and the second single-clad sheet includes a dielectric layer having a metal layer attached to a bottom surface thereof, the metal layers of such first and second single-clad sheets being etched to provide ground planes and external terminals for the electronic module. The double-clad sheet includes a dielectric layer having a first metal layer attached to a top surface of the dielectric layer and a second metal layer attached to a bottom surface of the dielectric layer, where the first and second metal layers thereof are etched to form desired lumped and distributed circuit elements. The electronic module has edge-plating along the perimeter thereof to connect the metal layers of the first and second single-clad sheets. A pair of in/out external terminals are also formed on at least one side of the electronic module to permit electrical connection thereto by a surface mounting configuration.

In a second aspect of the present invention, a process for making RF printed circuit modules is disclosed as including the steps of: providing a double-clad sheet having a dielectric layer with a first metal layer attached to a top surface of the dielectric layer and a second metal layer attached to a bottom surface of the dielectric layer; etching the first and second metal layers of the double-clad sheet in a specified pattern to form desired lumped and distributed circuit elements thereon; attaching a first single-clad sheet having a dielectric layer and a metal layer attached to the top surface thereof to the top of the double-clad sheet; attaching a second single-clad sheet having a dielectric layer and a metal layer attached to the bottom surface thereof to the bottom of the double-clad sheet; etching the metal layers of the first and second single-clad sheets in a specified pattern to form ground planes and external terminals thereon; providing edge-plating around the periphery of the RF printed circuit module between the metal layers of the first and second single-clad sheets; and forming external in/out terminals on at least one side of the RF printed circuit module to permit electrical connection thereto by a surface mounting arrangement.

In a third aspect of the present invention, a plurality of RF printed circuit modules are formed substantially simultaneously on a production panel. The RF printed circuit modules are arranged in clusters on the production panel and are attached to divider/support strips by means of support tabs. A microstrip transmission line is formed on a metal layer attached to the inner dielectric layer of the production panel to monitor the impedance of such microstrip transmission line and thereby control the etching of the metal layers attached to the inner dielectric layer of the RF printed circuit modules by maintaining the impedance level of such microstrip transmission line within a specified level. A stripline is also formed on a metal layer attached to the inner dielectric layer of the production panel, wherein the impedance of the stripline is monitored so that lamination of the dielectric and metal layers forming the RF printed circuit modules is controlled by maintaining the impedance of the stripline within a specified range.

BRIEF DESCRIPTION OF THE DRAWINGS

While the specification concludes with claims particularly pointing out and distinctly claiming the present invention, it is believed that the same will be better understood from the following description taken in conjunction with the accompanying drawings in which:

DETAILED DESCRIPTION OF THE INVENTION

Figure 1:
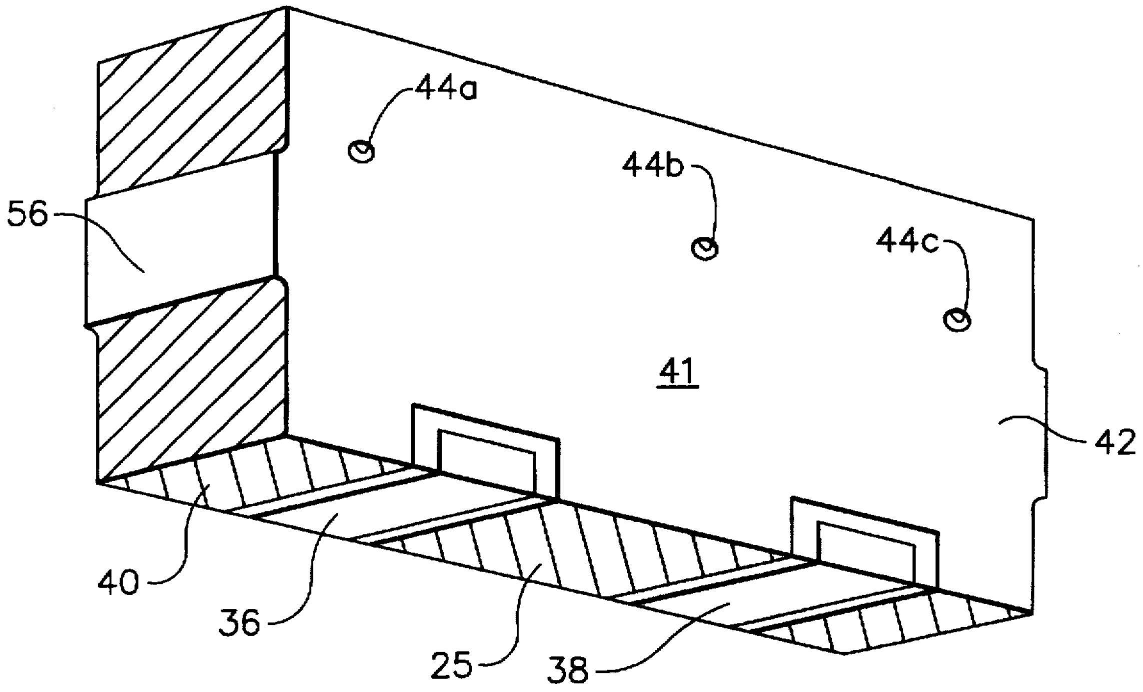
FIG. 1 is a perspective view of an RF printed circuit module made in accordance with the method of the present invention.

Referring to the drawings in detail, wherein identical numerals indicate the same elements throughout the figures, FIG. 1 depicts an electronic module 10 suitable for use in an RF communications environment which is made in accordance with the present invention. RF electronic module 10, as described herein, is a bandpass filter having a designated frequency bandwidth within the RF spectrum, but may be another type of circuit (such as a coupler or the like) depending upon the layout of the circuit elements, the number of layers, layer thickness, and type of material utilized for each layer. Thus, it will be understood that the inventive RF printed circuit module and the process used for making such RF printed circuit module would be just as applicable to other types of electronic modules and that the bandpass filter described herein is merely representative thereof.

Figure 2:
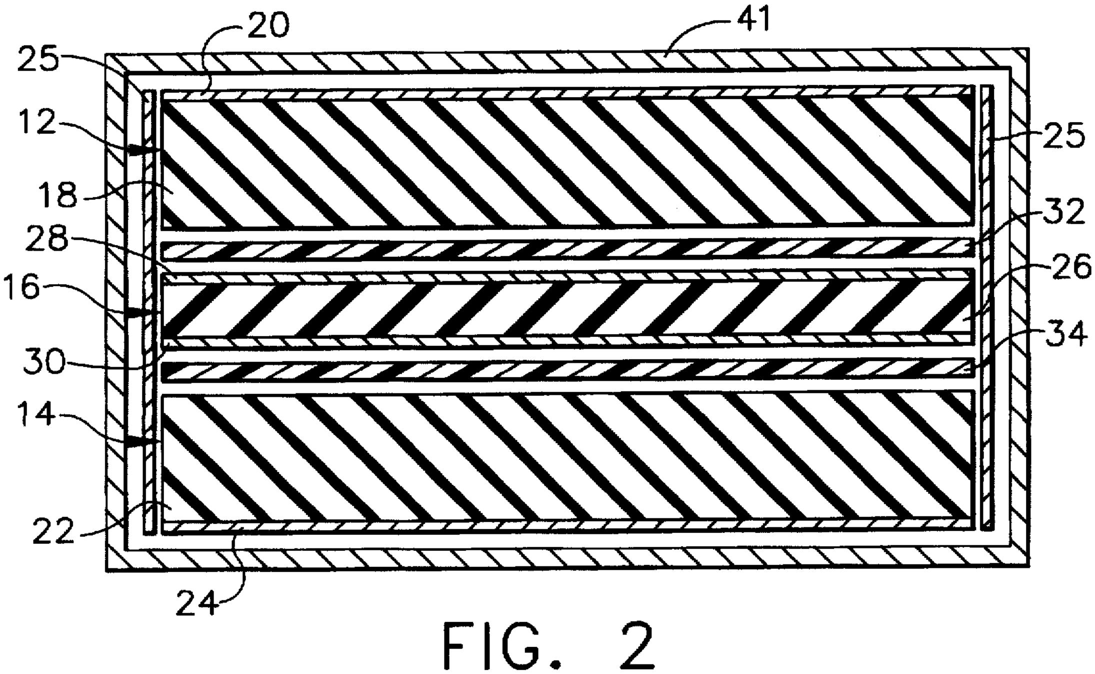
FIG. 2 is a side exploded diagrammatic view of the RF printed circuit module depicted in FIG. 1.

As best seen in FIG. 2, it will be noted that the particular construction of RF electronic module 10 includes a first single-clad sheet 12, a second single-clad sheet 14, and double-clad sheet 16 positioned between and attached to first and second single-clad sheets 12 and 14. It will be understood that first single-clad sheet 12 includes a layer of dielectric material 18 with a metal layer 20 attached to the top surface thereof. Similarly, second single-clad sheet 14 includes a layer of dielectric material 22 and a layer of metal 24 attached to its bottom surface. Double-clad sheet 16 includes a dielectric layer 26 having a first metal layer 28 attached to the top surface and a second metal layer 30 attached to the bottom surface. It will be understood that dielectric layers 18, 22, and 26 may be a plastic, ceramic, or glass and that metal layers 20, 24, 28 and 30 may be any conductive material (although copper is generally preferred). First and second single-clad sheets 12 and 14 and double-clad sheet 16 are all aligned and include a first layer of prepreg material 32 between first single-clad sheet 12 and double-clad sheet 16, as well as a second layer of prepreg material 34 between double-clad sheet 16 and second single-clad sheet 14 to adhere together first single-clad sheet 12, double-clad sheet 16, and second single-clad sheet 14. The prepreg material utilized preferably will be the same material as dielectric layers 18 and 22, but in a physical form enabling it to act as an adhesive during the lamination of first single-clad sheet 12, second single-clad sheet 14, and double-clad sheet 16. Although RF electronic module 10 is shown as including three separate dielectric layers and four separate metal layers, it will be understood that any number of dielectric and metal layers may be utilized according to the requirements or design of the circuit intended.

Figure 3:
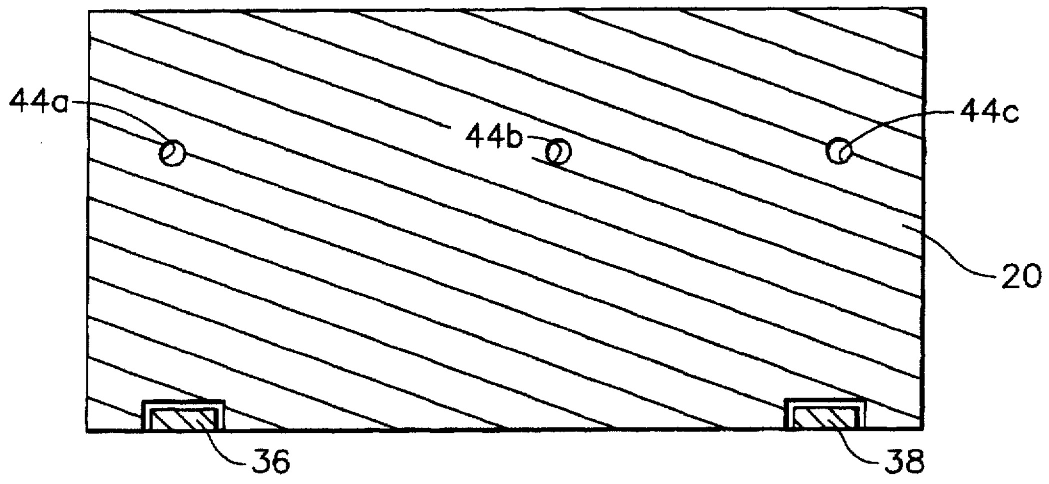
FIG. 3 is a top diagrammatic view of the metal layer on the first single-clad sheet.
Figure 4:
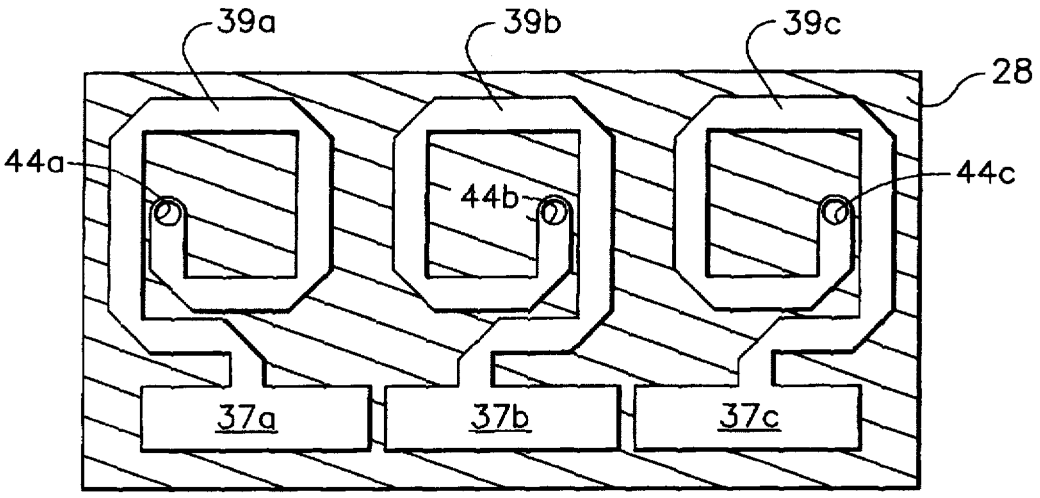
FIG. 4 is a top diagrammatic view of the first metal layer on the double-clad sheet.
Figure 5:
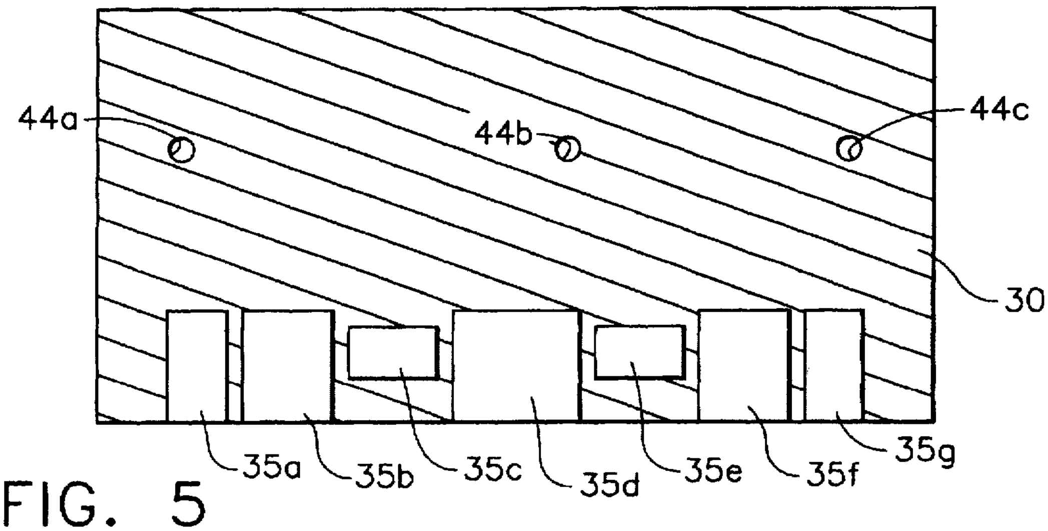
FIG. 5 is a bottom diagrammatic view of the second metal layer on the double-clad sheet.
Figure 6:
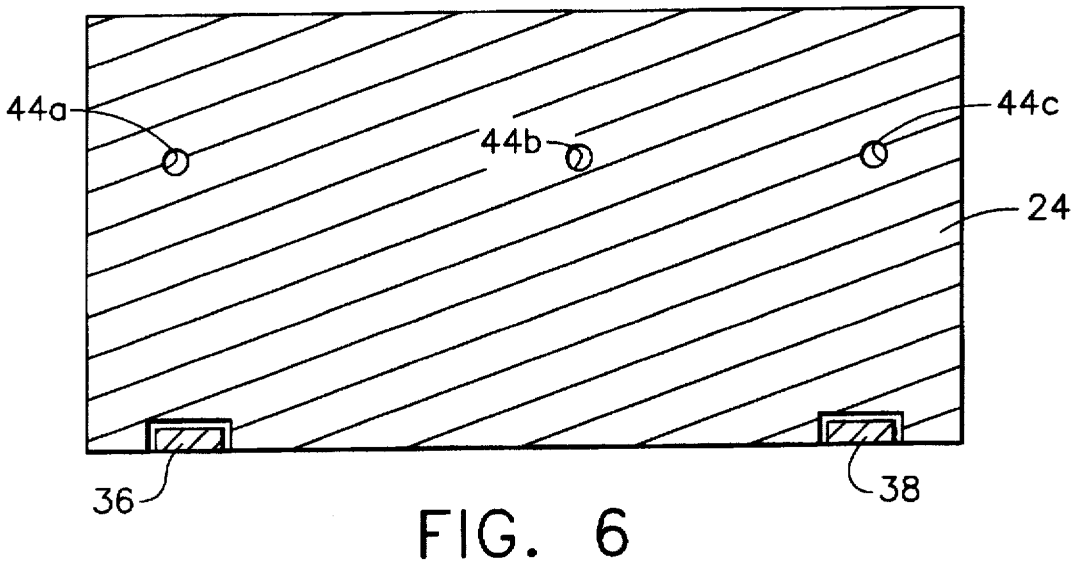
FIG. 6 is a bottom diagrammatic view of the metal layer on the second single-clad sheet.

With regard to the lumped and distributed circuit elements of RF electronic module 10, FIG. 4 depicts a plurality of capacitor plates **37*a–c* and a plurality of stripline inductors 39*a–c* etched onto first metal layer 28 of double-clad sheet 16 and FIG. 5 depicts a plurality of corresponding capacitor plates 35*a–g* etched onto second metal layer 30 of double-clad sheet 16. The patterns etched onto metal layer 20 of first single-clad sheet 12 and metal layer 24 of second single-clad sheet 14 are depicted in FIGS. 3 and 6, respectively, with these outer metal layers serving as ground planes for stripline inductors 39*a–c*, ground for shunt capacitive elements 35*b*, 35*d*, and 35*f*, and ground for plated vias through RF electronic module 10 (described hereinafter) from grounded inductors 39*a–c***.

With reference to FIGS. 1 and 2 it will also be seen that RF electronic module 10 includes edge-plating (indentified by the numeral 25) between all edges of metal layers 20 and 24 (FIG. 2) in order to provide the necessary shielding against RF interference for RF electronic module 10. This same edge-plating also connects to the internal circuitry of RF electronic module 10 through capacitor plates **35*a*, 35*b*, 35*d*, 35*f*, and 35*g* (FIG. 5) since each such capacitor plate extends to the edge of second metal layer 30 of double-clad sheet 16**.

Figure 7A:
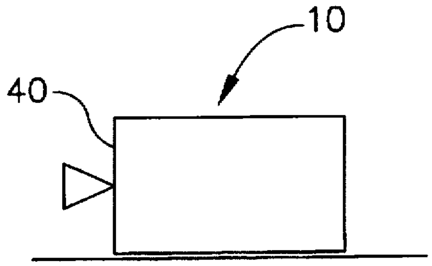
FIG. 7A is a diagrammatic depiction of a first mounting configuration for the RF printed circuit module depicted in FIG. 1.
Figure 7B:
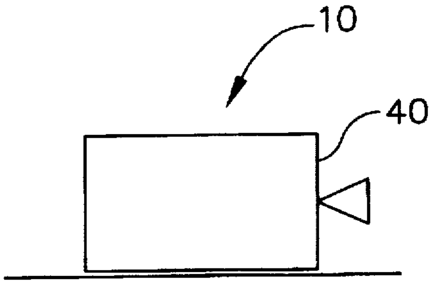
FIG. 7B is a diagrammatic depiction of a second mounting configuration for the RF printed circuit module depicted in FIG. 1.
Figure 7C:
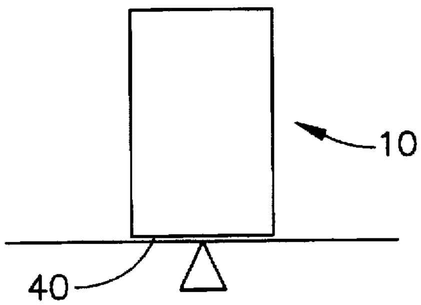
FIG. 7C is a diagrammatic depiction of a third mounting configuration for the RF printed circuit module depicted in FIG. 1.

It will be noted that RF electronic module 10 includes a pair of external in/out connections 36 and 38, which are made along one side 40 of RF electronic module 10 and extend past an edge of each metal layer 20 and 24 onto the top and bottom sides (only top side 42 being shown). In this way, RF electronic module 10 is able to be surface mounted to a host circuit board, for example, in several different orientations as depicted in FIGS. 7*a–c* to provide electrical connection between them. Accordingly, FIGS. 7*a* and 7*b* depict RF electronic module 10 being mounted in a manner having a low profile with a maximum footprint and FIG. 7*c* depicts RF electronic module 10 being mounted with an orientation having a high profile and a minimum footprint. It will be noted that external connections 36 and 38 are isolated from the ground planes formed by metal layers 20 and 24, as well as from the edge-plating around RF electronic module.

Figure 8:
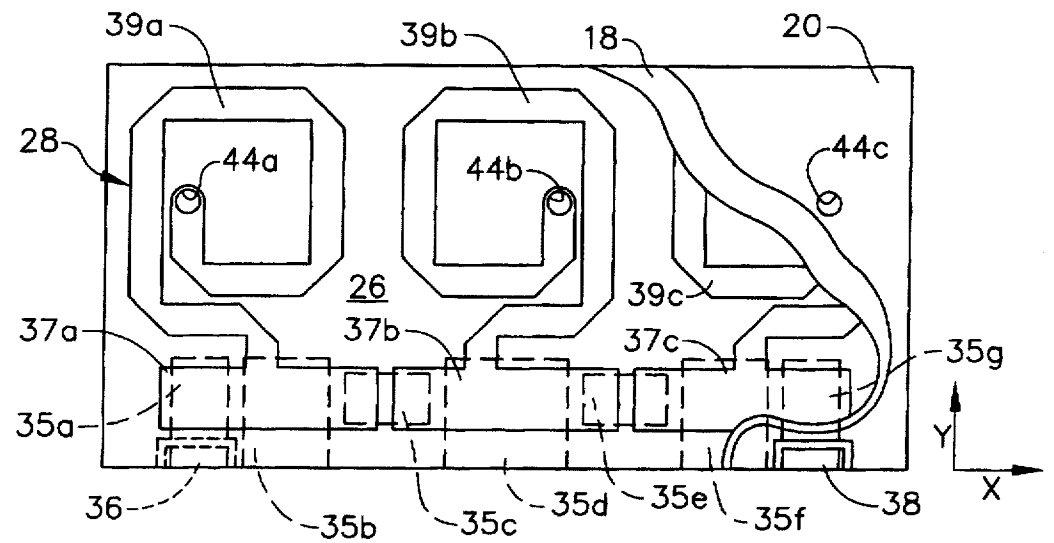
FIG. 8 is a diagrammatic depiction of the metal layers on the first and second single-clad sheets and the first and second metal layers of the double-clad sheet shown in FIGS. 3–6 superimposed on one another.

In order to prevent performance degradation stemming from process variations or errors in layer-to-layer registration, each set of opposing capacitor plates (e.g., capacitor plates 35*a–c* and capacitor plate 37*a*, capacitor plates 35*c–e* and capacitor plate 37*b*, and capacitor plates 35*e–g* and capacitor plate 37*c*) includes symmetrical, right-angle overhanging. More specifically, FIG. 8 indicates the superimposed alignment of metal layers 20, 28, 30 and 24. As seen therein, capacitor plates 35*a–g* and 37*a–c* are sized and arranged so that a certain amount thereof extends beyond the boundaries of the capacitor plates corresponding thereto. For example, capacitor plates 35*a*, 35*b*, 35*d*, 35*f*, and 35*g* are shown as extending a slight amount in a y direction past capacitor plates 37*a–c*, while capacitor plates 37*a–c* are shown as extending a slight amount in an x direction between and past capacitor plates 35*a–g*. Additionally, capacitor plates 37*a–c* extend a slight amount in a y direction past capacitor plates 35*c* and 35*e*. In this way, shifts of first metal layer 28 of double-clad sheet 16 with respect to and in parallel with second metal layer 30 causes very minimal changes in the opposing face areas thereof, whereby the capacitance values are not significantly affected and remain within desired design tolerances.

It will also be seen in FIGS. 1–6 that one or more vias or openings 44 are provided through RF electronic module 10. Vias 44 are plated with conductive material and are thus able to connect electrically metal layers 20 and 24 with first metal layer 28 of double-clad sheet 16 and/or second metal layer 30 of double-clad sheet 16, depending on the desired circuit design of RF electronic module 10. As seen in FIGS. 4 and 5, however, only stripline inductors 39*a–c* are directly connected to metal layers 20 and 24 by means of vias 44*a–c*, respectively. This is because capacitor plates 35*a* and 35*g* are aligned with external terminals 36 and 38, and are therefore able to receive current in this manner when RF electronic module 10 is connected to a host circuit board in the RF device.

Figure 9A:
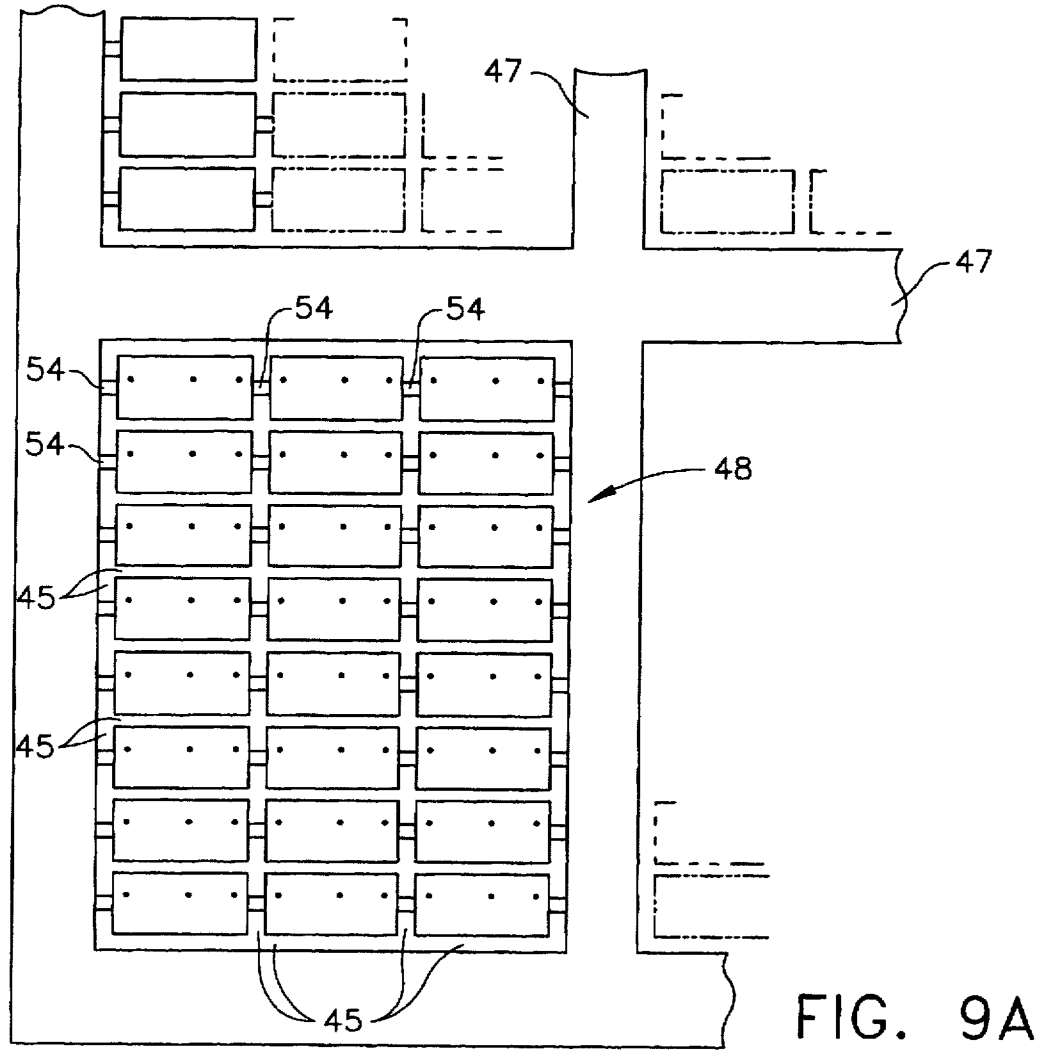
FIG. 9A is a partial, enlarged view of the panel layout of RF printed circuit modules depicted in FIG. 9.
Figure 9:
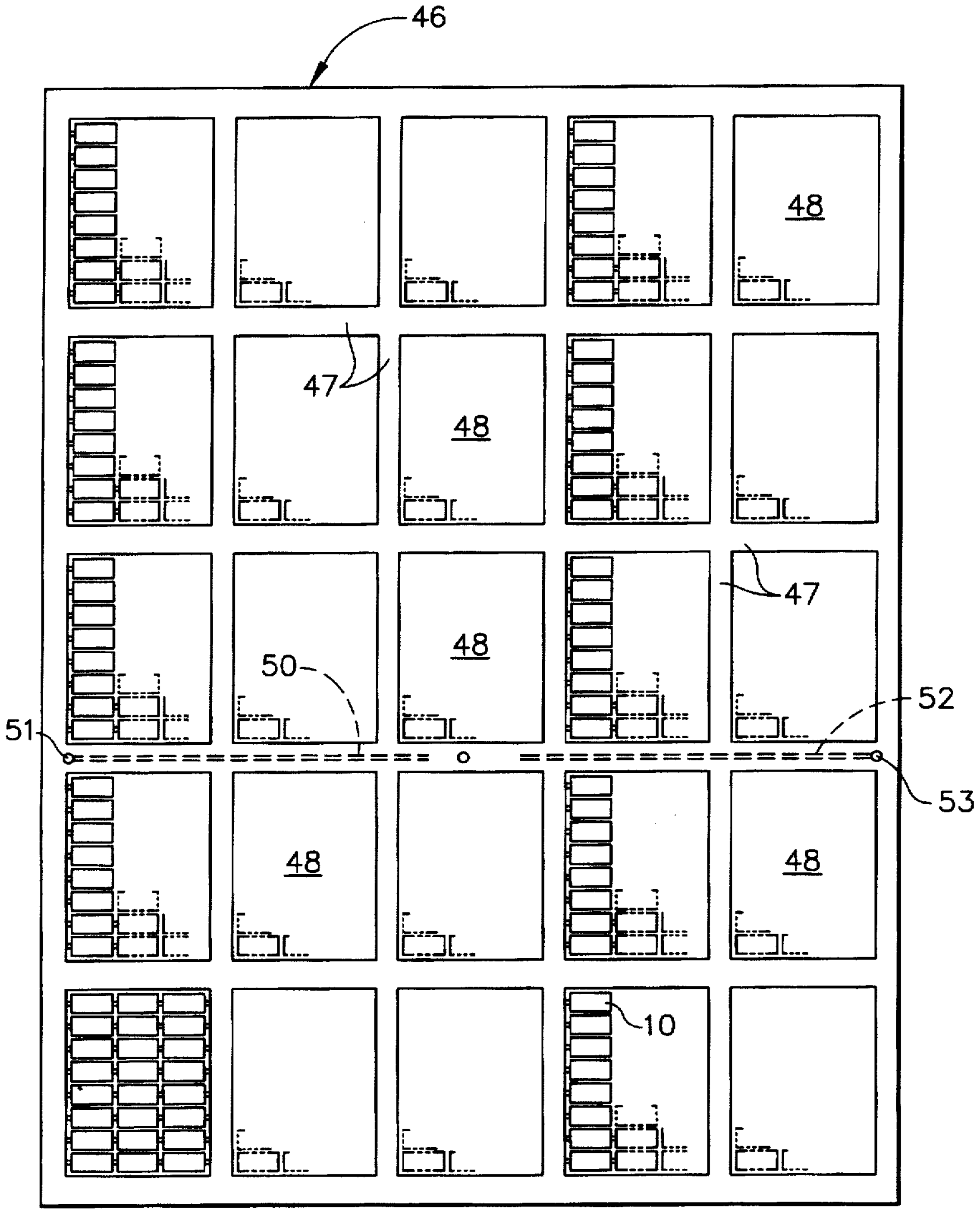
FIG. 9 is a diagrammatic top view of a panel layout used in constructing a plurality of RF printed circuit modules like that depicted in FIG. 1 in accordance with the method of the present invention.

With regard to the inventive process for making RF electronic module 10, it will be seen in FIG. 9 that a plurality of RF electronic modules 10 are preferably manufactured substantially simultaneously on a production panel 46. As seen therein, an exemplary layout includes the formation of twenty-four RF electronic modules 10 for each cluster 48, with an overall array of twenty-five clusters 48 preferably being arranged within production panel 46. It is believed that this particular arrangement best minimizes the gap areas between adjacent electronic modules 10 while maximizing the number of RF electronic modules 10 which can be manufactured in a given area.

The initial process step involves applying the necessary etching mask for the pattern of the circuits to be formed on first and second metal layers 28 and 30 (FIG. 2) of double-clad sheet 16, such as by utilizing known artwork and photographic processes. During this time, capacitive plates are generally formed on opposing first and second metal layers 28 and 30, where they are preferably sized and arranged so as to provide extended plate overhangs as described previously herein. As such, a cross-type arrangement is constructed, and any inaccuracies of artwork placement between the two layers (e.g., registration inaccuracies) within the overhang dimensions will not change the overlapping plate areas and, therefore, assure inner layer capacitance values consistent with design requirements.

As a control on the amount of etching or metal removal occurring on first and second metal layers 28 and 30 (FIG. 2), a microstrip transmission line 50 is built into production panel 46. It will be understood that transmission line 50 acts as a microstrip since it is positioned on dielectric layer 26 of double-clad sheet 16 before first and second metal layers 28 and 30 have been attached thereto. The impedance of microstrip transmission line 50 can then be measured through a port 51 in production panel 46, such as by means of a time domain reflectometer or a network analyzer, during the process on sample panels. This enables the etching time and solution to be adjusted so as to yield a measurement result for the microstrip impedance, set by its width and length, within a predetermined target range. Accordingly, the dimensions of the rest of the circuit are maintained within a desired tolerance so that the process can then be allowed to run production quantities with consistent, desirable results.

Etching masks are then applied to metal layers 20 and 24 of first and second single-clad sheets 12 and 14, respectively, to form the ground planes thereon and portions of in/out terminal contacts or external connections 36 and 38. Afterward, the metal between terminals 36 and 38 and the ground surfaces is etched away.

Referring to FIG. 2, prepreg layers 32 and 34, along with first and second single-clad sheets 12 and 14, are then applied to double-clad sheet 16 and pressed in place under high temperature and pressure for a specified time period (the parameters of which are dictated by such factors as the type of dielectric material and thickness of such dielectric material). Thus, RF electronic module 10 is made up of a lamination of first single-clad sheet 12, double-clad sheet 16, and second single-clad sheet 14.

It will be seen in FIG. 9 in conjunction with FIG. 2, that a stripline 52 is also built into either first metal layer 28 or second metal layer 30 within production panel 46, with metal layers 20 and 24 acting as a ground reference thereto. Stripline 52 is measured for its impedance through a port 53 in production panel 46 in a fashion similar to that for microstrip transmission line 50 discussed above to verify that it has a value within a target range that will assure the performance of the circuit components dependent upon the inner layer parameters. Depending upon the impedance of stripline 52, adjustments of the lamination parameters of pressure, temperature, and time for a given module design are made as necessary to achieve a result compatible with such target range. Accordingly, the lamination process can be established and then repeated in production with the target lamination parameters so that production quantities with consistent, desirable results can be produced.

Panel 46 is then drilled for plated-through hole or vias 44*a*–44*c* construction. Slots 45 are also cut with a router or similar device to establish the perimeter of each RF electronic module 10 in the given clusters 48 as indicated above. It will be noted that small, interconnecting support tabs 54 are maintained between both module ends and from each row-end module to the adjacent divider/support strips 47 of panel 46 (see FIG. 9A).

Panel 46 is then plated with copper or other similar conductive material. This serves the purposes of providing edge-plating around each RF electronic module 10 between metal layers 20 and 24 at each routed slot 45, connecting electrically external terminals 36 and 38 with the internal circuit elements that extend to side 40 of RF electronic module 10, as well as connecting electrically vias 44a–44c to the internal circuit elements aligned therewith. In effect, each RF electronic module 10 is now enclosed with a metal box or housing, except for the small tab areas, and the external connections 36 and 38 are established. At this point, etched terminals 36 and 38 are part of the continuous ground edge-plating around RF electronic module 10 and are not yet isolated.

A top coating metal or outer layers 41 (FIG. 2) is preferably applied (e.g., tin, solder, gold or the like) in order to enhance the soldering characteristics of each RF electronic module 10 and to protect the base metal. A removal process is then performed on panel 46 for separating each individual RF electronic module 10 therefrom. A router or punch preferably removes a slice of metal between metal layers 20 and 24 on either side of each module's external terminals 36 and 38 in order to isolate them from the adjacent edgeplating. The router or punch then cuts away each support tab 54 to release the completed RF electronic modules 10 from panel 46. A tab space 56 remains on each side of RF electronic module 10 where each support tab 54 has been removed (one of which is shown in FIG. 1). The individual RF electronic modules 10 are then complete and may be placed in carrying containers for handling and subsequent application into appropriate circuits through surface mounting techniques discussed above.

Having shown and described the preferred embodiment of the present invention, further adaptations of the RF electronic module 10 and the method of making such RF electronic modules can be accomplished by appropriate modifications by one of ordinary skill in the art without departing from the scope of the invention.

What is claimed is:

1. An electronic module for an RF device, comprising:

(a) a first single-clad sheet including a dielectric layer having a metal layer attached to a top surface of said dielectric layer;

(b) a second single-clad sheet including a dielectric layer having a metal layer attached to a bottom surface of said dielectric layer;

(c) a double-clad sheet including a dielectric layer having a first metal layer attached to a top surface of said dielectric layer and a second metal layer attached to a bottom surface of said dielectric layer, wherein said first and second metal layers are etched to form desired lumped and distributed circuit elements, said double-clad sheet being positioned between and attached to said first and second single-clad sheets;

(d) edge-plating along the perimeter of said electronic module connecting said metal layers of said first and second single-clad sheets;

(e) a pair of external terminals brined on at least one side of said electronic module to permit electrical connection thereto by a surface mounting arrangement; and (f) an outer layer around said first single-clad sheet, said second single-clad sheet, and said double-clad sheet.

2. The electronic module of claim 1, wherein said electronic module is an RF bandpass filter.

3. The electronic module of claim 1, wherein said distributed circuit elements comprise stripline resonators.

4. The electronic module of claim 3, wherein said metal layers of said first and second single-clad sheets are etched to serve as ground planes for said stripline resonators.

5. The electronic module of claim 1, wherein said electronic module is an RF coupler.

6. The electronic module of claim 1, further comprising at least one plated via through said electronic module, wherein said metal layers of said first and second single-clad sheets are connected electrically to at least one of said first and second metal layers of said double-clad sheet.

7. The electronic module of claim 1, wherein at least one of said metal layers of said first and second single-clad sheets is etched to form external terminals isolated from ground planes etched onto said metal layers of said first and second single-clad sheets.

8. The electronic module of claim 7, wherein said external terminals are formed by removing said edge-plating from a portion of at least one side of said electronic module between metal layers of said first and second single-clad sheets.

9. The electronic module of claim 1, said external terminals extending between and onto at least one of said metal layers of said first and second single-clad sheets, wherein said external terminals are available on any of such sides of said electronic module for surface mounting.

10. The electronic module of claim 9, wherein said electronic module is mountable to a host circuit board in a configuration allowing a low profile with a maximum footprint.

11. The electronic module of claim 9, wherein said electronic module is mountable to a host circuit board in a configuration allowing a high profile with a minimum footprint.

12. An electronic module for an RF device, comprising:

(a) a first single-clad sheet including a dielectric layer having a metal layer attached to a top surface of said dielectric layer;

(b) a second single-clad sheet including a dielectric layer having a metal layer attached to a bottom surface of said dielectric layer;

(c) a double-clad sheet including a dielectric layer having a first metal layer attached to a top surface of said dielectric layer and a second metal layer attached to a bottom surface of said dielectric layer, wherein said first and second metal layers are etched to form desired lumped and distributed circuit elements, said lumped circuit elements comprising capacitive elements and said double-clad sheet being positioned between and attached to said first and second single-clad sheets;

(d) edge-plating along the perimeter of said electronic module connecting said metal layers of said first and second single-clad sheets; and (c) a pair of external terminals formed on at least one side of said electronic module to permit electrical connection thereto by a surface mounting arrangement.

13. The electronic module of claim 12, wherein said metal layers of said first and second single-clad sheets are etched to serve as ground planes for said capacitive elements.

14. The electronic module of claim 12, said capacitive elements of said first and second metal layers of said double-clad sheet being sized and arranged so that changes in capacitance values are minimized during parallel shifts of one metal layer with respect to the other.

15. A production panel, comprising:

(a) a plurality of interconnecting divider/support strips;

(b) a plurality of RF printed circuit module clusters arrayed in said production panel, said clusters including a plurality of RF printed circuit modules connected to said divider/support strips by means of support tabs; and (c) means for measuring the impedance of a transmission line located on said production panel.

16. The production panel of claim 15, said transmission line comprising a stripline formed on a metal layer attached to an inner dielectric layer of said production panel, wherein lamination of a plurality of dielectric and metal layers forming said RF printed circuit modules is monitored and controlled by maintaining the impedance of said stripline within a specified range.

17. The production panel of claim 15, said transmission line comprising a microstrip formed on a metal layer attached to an inner dielectric layer of said production panel, wherein etching of metal layers attached to said inner dielectric layer is monitored and controlled by maintaining the impedance of said microstrip within a specified range.

18. A process for making an RF printed circuit module, comprising the following steps:

(a) providing a double-clad sheet having a dielectric layer with a first metal layer attached to a to surface of said dielectric layer and a second metal layer attached to a bottom surface of said dielectric layer;

(b) etching said first and second metal layers of said double-clad sheet in a specified pattern to form desired lumped and distributed circuit elements thereon;

(c) attaching a first single-clad sheet to the top of said double-clad sheet, said first single-clad sheet having a dielectric layer and a metal layer attached to a top surface of said dielectric layer;

(d) attaching a second single-clad sheet to the bottom of said double-clad sheet, said second single-clad sheet having a dielectric layer and a metal layer attached to a bottom surface of said dielectric layer;

(e) edge-plating the periphery of said RF printed circuit module between said metal layers of said first and second single-clad sheets;

(f) forming external terminals on at least one side of said RF printed circuit module to permit electrical connection thereto by a surface mounting arrangement; and (g) providing an outer layer around said first single-clad sheet, said second single-clad sheet, and said double-clad sheet.

19. The process of claim 18, further comprising the step of forming at least one via through said RF printed circuit module, wherein said metal layers of said first and second single-clad sheets are connected electrically to at least one of said first and second metal layers of said double-clad sheet.

20. The process of claim 18, further comprising the step of isolating said external terminals from said metal layers of said first and second single-clad sheets.

21. The process of claim 18, further comprising the step of isolating said external terminals from said edge-plating on at least one side of said RF printed circuit module.

22. The process of claim 18, further comprising the step of forming said lumped circuit elements on said first and second metal layers of said double-clad sheet so they are sized and arranged to minimize changes in capacitance values during parallel shifts of one metal layer with respect to the other.

23. The process of claim 18, wherein said lumped and distributed circuit elements are arranged to form an RF bandpass filter.

24. The process of claim 18, further comprising the step of extending said external terminals onto at least one of said metal layers of said first and second single-clad sheets, wherein said terminals are available on any of such sides of said RF printed circuit module for surface mounting.

25. A process for making a plurality of RF printed circuit modules substantially simultaneously on a production panel, comprising the following steps;

(a) providing a double-clad sheet having a dielectric layer with a first metal layer attached to a top surface of said dielectric layer and a second metal layer attached to bottom surface of said dielectric layer;

(b) etching said first and second metal layers of said double-clad sheet in a specified pattern to form desired lumped and distributed circuit elements thereon;

(c) attaching a second single-clad sheet to the top of said double-clad sheet, said first single-clad sheet having a dielectric layer and a metal layer attached to a top surface of said dielectric layer;

(d) attaching a second single-clad sheet to the bottom of said double-clad sheet said second single-clad sheet having a dielectric layer and a metal layer attached to a bottom surface of said dielectric layer;

(e) cutting slots into said production panel to establish the perimeter of each RF printed circuit module, wherein at least one support tab remains attaching each said RF printed circuit module to at least one of an adjacent RF printed circuit module or said production panel;

(f) edge-plating the periphery of each said RF printed circuit module between said metal layers of said first and second single-clad sheets; and (g) forming external terminals on at least one side of each said RF printed circuit module to permit electrical connection thereto by a surface mounting arrangement.

26. The process of claim 25, further comprising the step of removing said support tab from each RF printed circuit module.

27. The process of claim 25, further comprising the steps of:

(a) providing a microstrip transmission line on said production panel;

(b) monitoring the impedance of said microstrip transmission line; and (c) adjusting the time and solution of said etchings on said first and second metal layers of said double-clad sheet to cause said impedance to fall within a specified target range.

28. The process of claim 25, further comprising the steps of:

(a) providing a stripline on said production panel;

(b) monitoring the impedance of said stripline; and (c) varying the thickness and dielectric constant of said double-clad sheet to cause said impedance to fall within a specified target range.

29. An electronic module for an RF device, comprising:

(a) a first single-clad sheet including a dielectric layer having a metal layer attached to a top surface of said dielectric layer;

(b) a second single-clad sheet including a dielectric layer having a metal layer attached to a bottom surface of said dielectric layer; and (c) a double-clad sheet including a dielectric layer having a first metal layer attached to a top surface of said dielectric layer and a second metal layer attached to a bottom surface of said dielectric layer, wherein a first set of capacitor plates are etched onto said first metal layer of said double-clad sheet and a second set of capacitor plates are etched onto said second metal layer of said double-clad sheet, said double-clad sheet being positioned between and attached to said first and second single-clad sheets;

wherein said first and second sets of capacitor plates of said first and second metal layers of said double-clad sheet are sized and arranged so that at least some of the capacitor plates of said first set extend past the capacitor plates of said second set in a first direction and at least some of the capacitor plates of said second set extend past the capacitor plates of said first set in a second direction substantially perpendicular to said first direction, whereby changes in capacitance values are minimized during parallel shifts of one metal layer with respect to the other.

30. The electronic module of claim 29, further comprising edge-plating along the perimeter of said electronic module connecting said metal layers of said first and second single-clad sheets.

31. The electronic module of claim 30, further comprising at least one plated via through said electronic module, wherein said metal layers of said first and second single-clad sheets are connected electrically to at least one of said first and second metal layers of said double-clad sheet.

32. The electronic module of claim 29, further comprising a pair of external terminals formed on at least one side of said electronic module to permit electrical connection thereto by a surface mounting arrangement.

33. The electronic module of claim 32, said external terminals extending between and onto at least one of said metal layers of said first and second single-clad sheets, wherein said external terminals are available on any of such sides of said electronic module for surface mounting.

34. The electronic module of claim 29, wherein said metal layers of said first and second single-clad sheets are etched to serve as ground planes for said capacitive elements.

35. The electronic module of claim 34, wherein at least one of said metal layers of said first and second single-clad sheets is etched to form external terminals isolated from ground planes etched onto said metal layers of said first and second single-clad sheets.

36. The electronic module of claim 29, further comprising an outer layer around said first single-clad sheet, said second single-clad sheet, and said double-clad sheet.

* * * * *